US010425098B2

(12) United States Patent
Liu et al.

(10) Patent No.: US 10,425,098 B2
(45) Date of Patent: Sep. 24, 2019

(54) DIGITAL-TO-ANALOG CONVERTER (DAC) TERMINATION

(71) Applicant: Analog Devices Global, Hamilton (BM)

(72) Inventors: Tony Yincai Liu, Beijing (CN); Dennis A. Dempsey, Newport (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/947,222

(22) Filed: Apr. 6, 2018

(65) Prior Publication Data

US 2018/0323798 A1    Nov. 8, 2018

Related U.S. Application Data

(60) Provisional application No. 62/501,416, filed on May 4, 2017.

(51) Int. Cl.
| | |
|---|---|
| *H03M 1/80* | (2006.01) |
| *H03M 1/78* | (2006.01) |
| *H03M 1/08* | (2006.01) |
| *H03M 1/70* | (2006.01) |
| *G05D 3/14* | (2006.01) |
| *H03M 1/68* | (2006.01) |
| *H03M 1/10* | (2006.01) |
| *H03M 1/76* | (2006.01) |

(52) U.S. Cl.
CPC .......... *H03M 1/808* (2013.01); *G05D 3/1436* (2013.01); *H03M 1/08* (2013.01); *H03M 1/1057* (2013.01); *H03M 1/682* (2013.01); *H03M 1/70* (2013.01); *H03M 1/785* (2013.01); *H03M 1/68* (2013.01); *H03M 1/765* (2013.01)

(58) Field of Classification Search
None
See application file for complete search history.

(56) References Cited

U.S. PATENT DOCUMENTS 3,569,959 A    3/1971  Arase et al.
4,020,485 A    4/1977  Busby
(Continued)

OTHER PUBLICATIONS

"Analog Devices 16-Bit Precision, Low Power Metter on a Chip with Cortex-M3 and Connectivity", (c)2014 Analog Devices, Inc., Data Sheet ADuCM350 Rev. A, (2014), 41 pgs.

*Primary Examiner* — Howard Williams
(74) *Attorney, Agent, or Firm* — Schwegman Lundberg & Woessner, P.A.

(57) ABSTRACT

Embodiments of the disclosure can provide digital-to-analog converter (DAC) termination circuits. A single or multiple parallel impedance networks can be coupled to a DAC to reduce the DAC's AC impedance, increase the DAC speed, and reduce the DAC settling time. The parallel impedance networks can be coupled to one or more of the DAC terminals in termination specific cases, or to nodes within the DAC. In an example, one-sided T-termination can be used with a single termination impedance path coupled in parallel with the DAC terminals, for reducing AC impedance at the DAC reference terminals, increasing speed, and reducing settling time. In an example, multiple impedance networks can be used in an H-bridge termination solution, which can be useful for high resolution DACs with or within a high voltage range.

19 Claims, 11 Drawing Sheets

(56) References Cited

U.S. PATENT DOCUMENTS

| | | | |
|---|---|---|---|
| 5,534,862 A * | 7/1996 | Gross, Jr. | H01C 3/12 |
| | | | 341/144 |
| 5,684,481 A | 11/1997 | Ashe | |
| 5,969,657 A | 10/1999 | Dempsey et al. | |
| 6,445,325 B1 | 9/2002 | Burns | |
| RE38,083 E | 4/2003 | Ashe | |
| 6,781,537 B1 | 8/2004 | Taraschuk et al. | |
| 7,095,351 B2 | 8/2006 | Kirby et al. | |
| 7,136,002 B2 | 11/2006 | Dempsey et al. | |
| 7,982,581 B2 | 7/2011 | Jha et al. | |
| 8,766,898 B2 | 7/2014 | Chen et al. | |
| 9,065,479 B2 | 6/2015 | Dempsey | |
| 9,100,045 B2 | 8/2015 | Dempsey | |
| 9,444,487 B1 | 9/2016 | Dempsey | |
| 9,478,188 B1 | 10/2016 | Chang | |
| 2011/0175876 A1 * | 7/2011 | Chang | G09G 3/3655 |
| | | | 345/211 |

\* cited by examiner

DIGITAL-TO-ANALOG CONVERTER (DAC) TERMINATION

CLAIM OF PRIORITY

This Application claims the benefit of priority to U.S. Provisional Patent Application Ser. No. 62/501,416, filed on May 4, 2017, which is hereby incorporated by reference in its entirety.

FIELD OF THE DISCLOSURE

The disclosure relates generally to the field of digital-to-analog converters (DACs). More specifically, the disclosure relates to DAC termination circuits.

BACKGROUND

Digital-to-analog converters (DACs) are well known in the art and are used to decode a digital input signal to a corresponding output analog signal. DACs that are configured to operate in voltage mode, in which an output analog voltage that corresponds to an input digital signal is produced, typically have their outputs buffered by an amplifier (e.g., an operational drive amplifier).

The output range of a DAC is an important consideration for DAC design and implementation. FIG. 1 illustrates example DAC circuits with various DAC range modification solutions. Referring to FIG. 1, there are illustrated DAC circuits 100, 102, and 104. The DAC circuit 100 includes a DAC impedance string 110 and a buffer amplifier 114. The DAC impedance string 110 can be a ladder DAC, such as an R/2R DAC using a plurality of R/2R voltage divider chains. In this regard, the DAC circuit 100 includes R/2R range scaling. An optional gain resistor 112 can be used at the output of the DAC to further scale the DAC 110 output before the amplifier 114.

The DAC circuit 102 includes a DAC impedance string ($R_{DAC}$) 118, a buffer amplifier 120, and a gain resistor 116. The DAC impedance string 118 can be an R/2R DAC using a plurality of R/2R voltage divider chains. The gain resistance 116 can be equal to the resistance $R_{DAC}$, and can be coupled in series with the DAC impedance string 118. In this regard, the DAC circuit 102 includes dual string range scaling, where the DAC output range can be scaled within the DAC impedance string 118 and or using the gain resistor 116.

The DAC circuit 104 uses dual string range selection. More specifically, the DAC impedance string 124 is coupled in series to a first gain resistor 122 and a second gain resistor 126. The first gain resistor 122 can be used for scaling down the output range of the DAC impedance string 124, and the second gain resistor 126 can be used to shift up the output range of the DAC impedance string 124.

The DAC circuit termination options illustrated in FIG. 1 have certain drawbacks resulting from the resistors in series connections. More specifically, the DAC circuits illustrated in FIG. 1 can be characterized with increased output impedance, which limits the DAC speed (e.g., settling speed) and increases output noise and glitching.

SUMMARY OF THE DISCLOSURE

Embodiments of the disclosure can provide digital-to-analog converter (DAC) termination circuits, such as parallel impedance networks. A DAC circuit with a parallel impedance network can include a pair of voltage reference nodes for applying different voltage levels, and impedance elements arranged in an impedance string for coupling between the voltage reference nodes to generate a plurality of voltage signals. The DAC circuit can also include a termination impedance path, which includes at least a first termination impedance element and a second termination impedance element. The termination impedance path is coupled between the voltage reference nodes and at least the second termination impedance element coupled in shunt with the impedance string. The DAC circuit can also include a switching network configured to receive a digital signal and, in response, selectively couple one or more of the plurality of generated voltage signals to generate a combined analog voltage DAC output signal providing an analog representation of the digital signal.

In certain embodiment, a DAC circuit with multiple parallel impedance networks includes a pair of voltage reference nodes for applying different voltage levels, a first termination impedance path and a second termination impedance path. The first termination impedance path includes at least a first termination impedance element and a second termination impedance element, where the first termination impedance path is coupled between the voltage reference nodes. The second termination impedance path includes at least a third termination impedance element and a fourth termination impedance element. The second termination impedance path is coupled between the voltage reference nodes and in shunt with the first termination impedance path. The DAC circuit can further include a first plurality of impedance elements arranged in an impedance string for coupling between the first termination impedance path and the second termination impedance path, to generate a plurality of voltage signals. The DAC circuit can further include a switching network configured to receive a digital signal and, in response, selectively couple one or more of the plurality of generated voltage signals to generate a combined analog voltage DAC output signal, the DAC output signal providing an analog representation of the digital signal.

In certain embodiments, a method for reducing alternating current (AC) impedance of a digital-to-analog converter (DAC) circuit is provided. The method can include configuring an impedance string to receive a first voltage reference signal of a pair of voltage reference signals via a first termination impedance element of a termination impedance path, to reduce a first AC termination impedance of the impedance string. The method can further include configuring the impedance string to receive, a second voltage reference signal of the pair of voltage reference signals while coupled in shunt with a second termination impedance element of the termination impedance path, to reduce a second AC termination impedance of the impedance string during a shunt AC operation mode. The method can further include generating a plurality of voltage reference signals in response to applying the first voltage reference signal and the second voltage reference signal. The method can further include receiving a digital signal comprising digital data. The method can further include, in response to the digital signal, selectively coupling one or more of the plurality of generated voltage signals to generate a combined analog voltage DAC output signal providing an analog representation of the digital signal.

In another example, at least one computer-readable storage medium can be provided to include instructions that, when executed on a processing unit of an embedded sensor system, cause the processing unit to perform one or more steps of the methods described herein. The processing unit can be associated with a cloud-based or edge-based computing environment. The processing unit can include a controller, a micro-controller, a micro- or mini-computer, a processor, a digital signal processor (DSP), and a central processing unit (CPU). The processing unit can also be achieved via a distributed processing network (e.g., a cloud network), rather than a single unit.

This overview is intended to provide an overview of subject matter of the present patent application. It is not intended to provide an exclusive or exhaustive explanation of the invention. The detailed description is included to provide further information about the present patent application.

Figure 1:
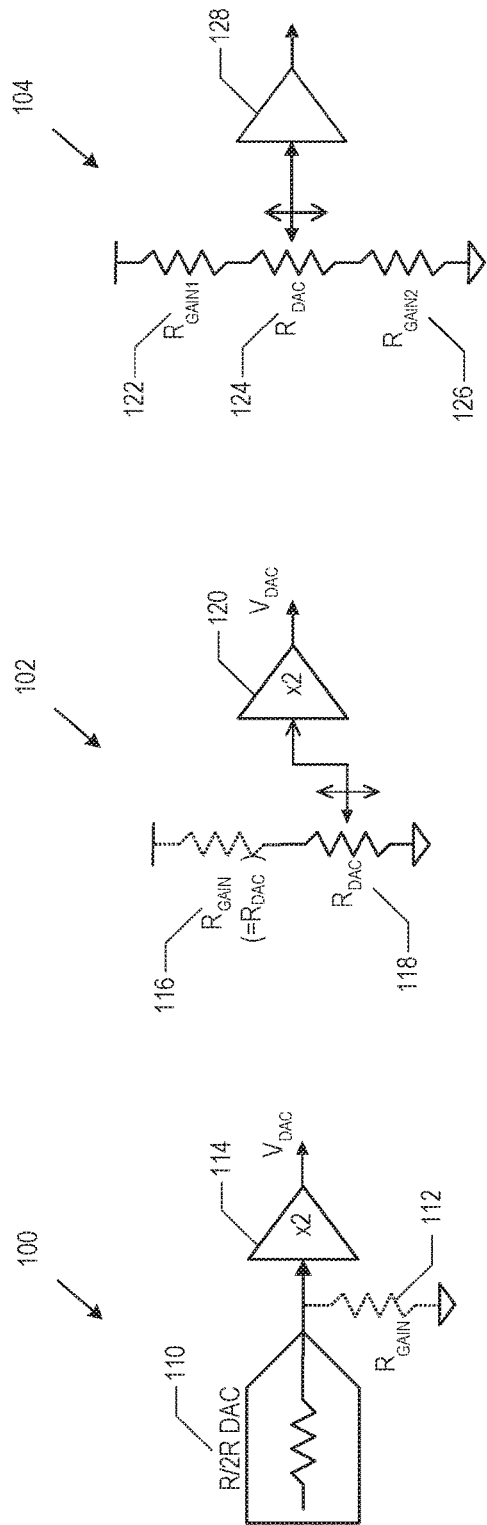
FIG. 1 illustrates example DAC circuits with various DAC range modification solutions.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In accordance with proposed techniques, one or more parallel impedance networks can be coupled to a DAC to reduce the DAC's alternating current (AC) impedance, increase the DAC speed, reduce the DAC and system settling time, and, otherwise, modify the DAC transfer function (e.g., as associated with code-dependent network configurations and calibration capabilities). The one or more parallel impedance networks (or termination impedance paths) can be coupled to one or more of the DAC terminals in termination specific cases. In an example, one or more nodes within the parallel impedance networks can be coupled to nodes within the DAC module. In an example, one-sided T-termination can be used with a single termination impedance path coupled in parallel with the DAC reference terminals, for reducing AC impedance at the DAC reference terminals, increasing speed, and reducing settling time. In an example, multiple impedance networks can be used in an H-bridge termination solution, which can be useful for high resolution DACs with high voltage range. One or more resistors (or other impedances) can be used within each termination impedance path. In an example, the impedances within each termination impedance path can be variable to achieve variable DAC range for a wider DAC dynamic range.

Figure 2A:
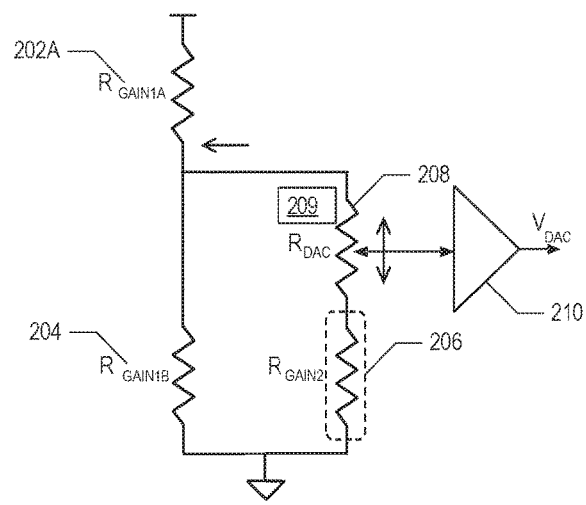
FIG. 2A depicts a DAC with a one-sided termination network between the reference terminals, in accordance with an example embodiment.

FIG. 2A depicts a DAC with a one-sided termination network between the reference terminals, in accordance with an example embodiment. Referring to FIG. 2A, the DAC circuit 200A includes an impedance string 208 (abbreviated as $R_{DAC}$), a buffer amplifier 210, and gain resistors 202A and 204 forming a termination impedance path. As seen in FIG. 2A, the termination impedance path formed by gain resistors 202A and 204 can be coupled between reference nodes generating reference voltages, where one of the nodes can be coupled to a ground. In an example, $R_{GAIN1A}$ and $R_{GAIN1B}$ can be coupled in a T-configuration with the DAC impedance string 208. More specifically, $R_{GAIN1A}$ can be coupled serially with the DAC impedance string 208, and $R_{GAIN1B}$ can be coupled in parallel with the DAC impedance string 208. In instances when $R_{GAIN1B}$ is very high, the DAC circuit 200A become similar to the DAC circuit 104 in FIG. 1. In instances when $R_{GAIN1A}$ and $R_{GAIN1B}$ are smaller than the DAC impedance string 208 resistance ($R_{DAC}$), the output voltage signal Vdac is set primarily by the ratio of $R_{GAIN1A}$: $R_{GAIN1B}$.

In an example, a third gain resistor 206 ($R_{GAIN2}$) can be coupled in series with the DAC impedance string 208 and in shunt with gain resistance 204 to shift the output range of the DAC impedance string 208. In instances when $R_{GAIN1A}$, $R_{GAIN1B}$, and $R_{GAIN2}$ are close to zero, the maximum output resistance of the DAC circuit 200A is $R_{DAC}/2$, resulting in an impedance hard limit for the DAC circuit 200A.

In this regard, low values for $R_{GAIN1A}$ and $R_{GAIN1B}$ (as well as $R_{GAIN2}$, if used), result in reduction of the AC impedance of the DAC circuit 200A, as well as reduction in the DAC noise, settling time (i.e., DAC speed is increased), and glitching.

In an example, the DAC impedance string 208 can include a switching network 209 configured to receive a digital signal, and selectively couple one or more of a plurality of generated voltage signals (e.g., voltage signals generated by a plurality of impedance elements within the DAC impedance string 208) to generate a first representation of combined analog voltage DAC output signal, providing an analog representation of the digital signal. The first representation of the analog voltage DAC output signal can be buffered by buffer amplifier 210, which can output a second representation of the analog voltage output signal (e.g., Vdac).

In an example, the switching network can include one or more switches, such as MOS switches, CMOS, FinFETs, Gate all around (GAA) MOS switches, Micro-Electro-Mechanical Switches (MEMS), and Nano-Electro-Mechanical Switches (NEMS), as well as other types of switches.

Figure 2B:
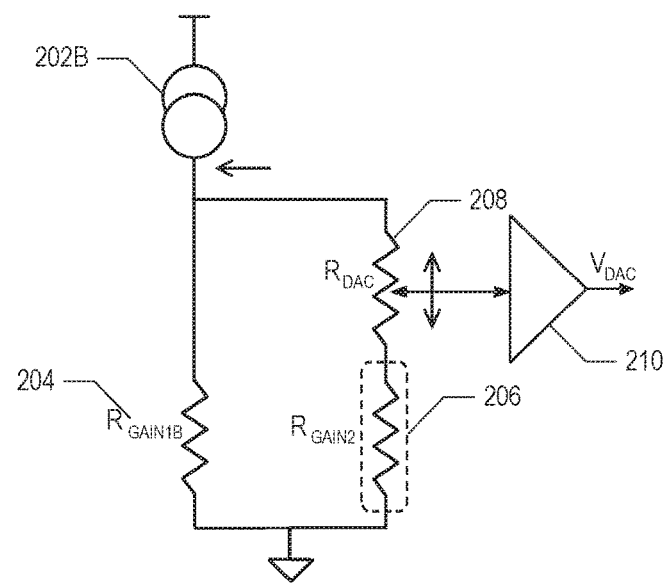
FIG. 2B depicts a DAC with a one-sided termination network using a current source between the reference terminals, in accordance with an example embodiment.

FIG. 2B depicts a DAC with a one-sided termination network using a current source between the reference terminals, in accordance with an example embodiment. Referring to FIG. 2B, the DAC circuit 200B includes the same elements as DAC circuit 200A in FIG. 2A, except that a current source 202B is used in place of the gain resistance 202A within the DAC termination impedance path. In an example, the current source 202B can be outside of the DAC circuit 200B, and can couple to at least one of the reference terminals. In this regard, the reference nodes can be driven by voltage levels, a current source, or another type of active circuitry to achieve target reference level(s).

Figure 3:
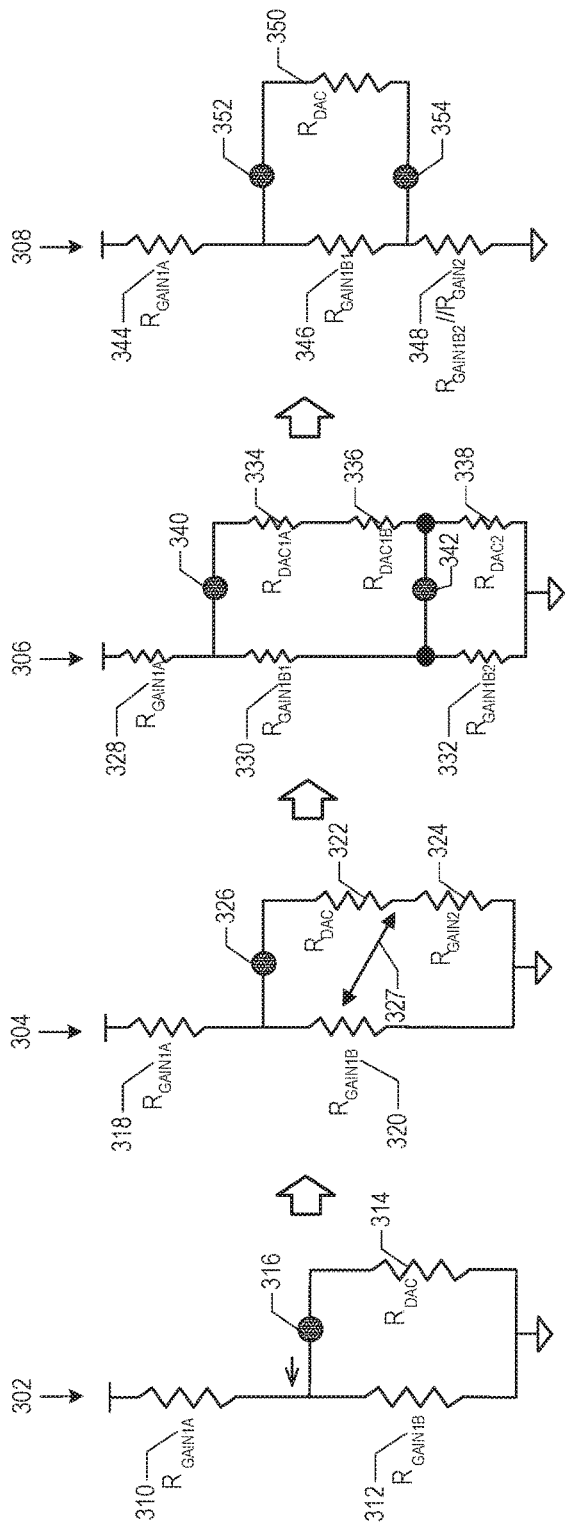
FIG. 3 depicts example DACs using one-sided termination networks between the reference terminals with a single or multiple shunt nodes, in accordance with example embodiments.

FIG. 3 depicts example DACs using one-sided termination networks between the reference terminals with a single or multiple shunt nodes, in accordance with example embodiments. Referring to FIG. 3, there are illustrated various DAC circuits 302-308 using one-sided termination networks. For example, the DAC circuit 302 includes an impedance string 314 (with a total resistance/impedance indicated as $R_{DAC}$) and gain resistors 310 and 312 forming a termination impedance path. As seen in FIG. 3, the termination impedance path formed by gain resistors 202A ($R_{GAIN1A}$) and 204 ($R_{GAIN1B}$) can be coupled in a T-configuration with the DAC impedance string 314. More specifically, $R_{GAIN1A}$ 310 can be coupled serially with the DAC impedance string 314, and $R_{GAIN1B}$ 312 can be coupled in parallel with the DAC impedance string 314, at the shunt node 316.

The following is example circuit analysis for the DAC circuit 302:

Assuming $R_{GAIN2}=0$ (as seen in FIG. 3, $R_{GAIN2}$ is not used with DAC circuit 302), the DAC divide (or scaling) factor m can be defined as:

(Rdac//Rgain1b)/((Rdac//Rgain1b)+Rgain1a)=1/m.

Assuming further Rgain1a=Rgain, Rgain1b=k*Rgain, and Rgain=k2*Rdac (i.e., Rgain1a is scaled relative to DAC impedance). Solving the m factor equation provides the following solution dependent on design choices:

$$R_{GAIN1B} = \frac{k2}{m-1-k2} \cdot R_{DAC}$$

The resulting Rgain1b equation indicates that DAC string impedance (Rdac 314) is a limiting choice, which can be considered first when designing the termination network impedances (Rgain1a and Rgain1b).

In an example, the DAC string impedance (Rdac 314) can be equal to the total circuit impedance (i.e., Rtotal=Rdac, and it appears to reference inputs of the DAC circuit 302 that no re-configuration or division is taking place). The resulting impedance equations are as follows:
Rtotal=$R_{DAC}$=$R_{DAC}$*k2+$R_{DAC}$//Rgain1b;
Rgain1a=Rgain=k*$R_{DAC}$; and $$R_{GAIN1B} = \frac{k2}{m-1-k2} \cdot R_{DAC}.$$

Solving the equations yields:

$$k2 = \frac{m-1}{m}; R_{GAIN1A} = k2 \cdot R_{DAC} = \frac{m-1}{m} \cdot R_{DAC};$$

-continued $$\text{and } R_{GAIN1B} = \frac{1-k2}{k2} \cdot R_{DAC} = \frac{R_{DAC}}{m-1}.$$

Referring to FIG. 3, the DAC circuit 304 includes an impedance string 322 (with a total resistance/impedance indicated as $R_{DAC}$) and gain resistors 318, 320, and 324 forming a termination impedance path coupled in a T-configuration. More specifically, gain impedance $R_{GAIN1A}$ 318 can be coupled serially with the DAC impedance string 322 and gain impedance $R_{GAIN2}$ 324, and $R_{GAIN1B}$ 320 can be coupled in shunt with the DAC impedance string 322, at the shunt node 326.

The following is example circuit analysis for the DAC circuit 304:

The DAC circuit 304 divide (or scaling) factor m can be defined as:

((Rdac+Rgain2)//Rgain1b)/(((Rdac+Rgain2)//Rgain1b)+Rgain1a)=1/m,

Where: Rgain1a=Rgain=k2*Rdac,
Rgain1b=k*Rgain,
Rgain2=k3*Rgain,
Rdac+Rgain2=k4*Rdac.

The above analysis for DAC circuit 302 can be re-used, replacing Rdac with k4*Rdac. In this regard, a minimum DAC output level is now a combination of the m divider ratio and the Rdac:Rgain2 ratio. Gain resistance Rgain2, therefore, can be used for creating offset on minimum DAC output level, but with added noise and DAC bandwidth reduction.

Gain resistance $R_{GAIN2}$ can be expressed in relation to the DAC impedance string resistance $R_{DAC}$ as follows: $R_{GAIN2}=R_{DAC}*V_{ZS}/(V_{FS}-V_{ZS})$ and $R_{DAC}+R_{GAIN2}=R_{DAC}*V_{FS}/(V_{FS}-V_{ZS})=R_{DAC}*k4$, where k4 is new scalar for zeroscale and k4=$V_{FS}/(V_{FS}-V_{ZS})$, with $V_{ZS}$ and $V_{FS}$ being zeroscale and fullscale voltages respectively. Example termination impedance path design considerations can include defining target output levels, with setting specific levels of DAC power and noise by selecting Rdac and k4. In configurations when DAC speed is sufficient, series attenuation (e.g., resistance in series with the DAC impedance string) may suffice. In configurations when DAC speed is insufficient, additional termination impedance may be added to the DAC circuit 304 to improve speed (e.g., by re-using the same impedance string without additional impedance elements, by optionally using new, additional circuitry, or by using a reduced set of circuitry by bypassing certain circuitry).

In an example, the DAC circuit 304 can use an additional shunt (e.g., at positions indicated by line 327) to improve AC impedance at the bottom of the DAC impedance string 322 without changing the DAC linearity. For example, a midpoint within the DAC impedance string 322 can be coupled in shunt with a point within the termination impedance string that is parallel with the DAC impedance string 322 (e.g., a mid-point within the gain resistance 320). In another example, a midpoint of the DAC impedance string 322 and the gain resistance 324 can be coupled in shunt with a point within the termination impedance string that is parallel with the DAC impedance string 322. The additional coupling between DAC impedance strings that are already connected in parallel (or shunt) can be used to lower AC impedance (Z) at mid-codes as well as impact DAC direct current (DC) performance and integral non-linearity (INL) of the DAC circuit.

The following is example AC impedance (Z) for the DAC circuit 304. This is a single supply example with a positive voltage reference and zero volts used for the negative reference level and the attenuation factor from the positive reference to the top terminal of the DAC impedance Rdac can be designated as m (e.g., m=2 for divide by 2). Rtotal can designate the total or equivalent impedance between reference terminals. Rgain2 indicates the Rdac offset resistor. For a given Rdac, Rtotal and Rdac attenuation factor (m), Rgain2 can be determined as follows:

Rgain1$a$=Rtotal*($m$−1)/$m$(i.e., Rgain1$a$ does reference range attenuation);

Rgain1$b$//(Rdac+Rgain2)=Rtotal/$m$ (second part of the DAC attenuation network).

Rgain1$a$ can be defined by m and Rtotal, and Rgain1$b$ can be defined by m, Rtotal and Rdac, as follows: Rgain1$b$=Rtotal*(Rdac+Rgain2)/($m$*(Rdac+Rgain2)−Rtotal).

AC impedance (Z_dactop) at top of Rdac is Rgain1$a$//Rgain1$b$//(Rdac+Rgain2). Rgain1$b$//(Rdac+Rgain2)=>Rtotal/m (by definition of m factor attenuation). Rgain1$a$//Rgain1$b$//(Rdac+Rgain2)=>Rtotal*($m$−1)/$m$//Rtotal/$m$=>Z_dactop=Rtotal*($m$−1)/$m^2$.

The above Z solution can be used to reduce the AC impedance (at cost of additional network power) for a given Rdac value.

Referring to FIG. 3, the DAC circuit 306 includes impedance strings 334, 336, and 338 (with a total resistance/impedance indicated as Rdac1$a$, Rdac1$b$, and Rdac1$c$) and gain resistors 328, 330, and 332 forming a termination impedance path with two shunt nodes 340 and 342 with the DAC impedance string for lowering AC impedance (Z).

As seen in FIG. 3, the gain resistors of circuit 304 can be broken up (prior to applying shunt connections at nodes 340 and 342) to obtain the circuit 306. More specifically, Rgain1$b$ can be separated into Rgain1$b$1 330 and Rgain1$b$2 332. Rdac (322) and +Rgain2 (324) can be separated into Rdac1 and Rdac2 (338), with Rgain2 being optional. Rdac1 can be separated into Rdac1$a$ (334) and Rdac1$b$ (336). From the above analysis of circuit 302 (with Rgain2=0):

$$R_{GAIN1A} = k2 \cdot R_{DAC} = \frac{m-1}{m} \cdot R_{DAC};$$

$$R_{GAIN1B} = \frac{1-k2}{k2} \cdot R_{DAC} = \frac{R_{DAC}}{m-1}$$

In an example, the DAC circuit 306 can be balanced, the same top and bottom termination resistance, i.e., Rgain1$a$=Rgain1$b$2//Rdac2. In this case, output voltage (Vout) can be generated from centre of Rdac1$a$ and Rdac1$b$ impedance strings (i.e., Rdac1$a$=Rdac1$b$).

In an example when Rgain2=0, DAC circuit 306 resistance can be set by the DAC core (Rdac). Rgain1$a$ resistor can be set by attenuation (m) and Rdac, so that $$R_{GAIN1A} = k2 \cdot R_{DAC} = \frac{m-1}{m} \cdot R_{DAC}.$$

In a limiting case, m=1 (no attenuation) and Rgain1$a$=0 (i.e., it is not present), then:

$$R_{GAIN1B} = \frac{1-k2}{k2} \cdot R_{DAC} = \frac{R_{DAC}}{m-1}.$$

In an example, Rgain2 in circuit 304 (and Rdac2 in circuit 306) can be zero, which results in equivalent DAC circuit 308 using termination impedance string formed by Rgain1$a$, Rgain1$b$1 and Rgain1$b$2, with two shunt nodes 352 and 354 between the DAC impedance 350 (formed by Rdac1$a$ and Rdac1$b$). The Rdac string second terminal (336) is coupled to the first attenuation network (termination impedance string formed by Rgain1$b$1 346) at shunt node 354. In this regard, Rgain1$b$2 332 can be merged with Rgain2 as one impedance network (Rgain1$b$2//Rgain2 348) to reduce AC impedance at top and bottom of the DAC impedance string 350, as seen in DAC circuit 308. Coupling the bottom of Rdac string 350 to an equivalent point of Rgain1$b$1 346 via shunt node 354 does not impact INL, but it impacts the DAC circuit 308 end-point accuracy and precision, as well as reducing AC impedance (Z). In this case, Rgain1$b$2 and Rgain2 are merged together as impedance string 348, which results in performance improvements as well as area and component cost savings.

In reference to DAC circuit 304, resistor split (and thus location of the shunt nodes 340 and 342) can be performed based on minimizing the AC impedance Z. For example, the ratios Rgain1$b$1:Rgain1$b$2 and Rdac1:Rdac2 can be determined with ratio optimization. In an example, both ratios can be the same. The DAC impedance string resistance Rdac and m can define Rgain1$a$ and Rgain1$b$.

The following is circuit analysis in connection with DAC circuit 104 (FIG. 1) in comparison to DAC circuit 304 (FIG. 3). For the series-coupled DAC circuit 104—reference voltage is 1.8V, and DAC output range is 0.2V to 1V. $R_{DAC}$ attenuation factor m1$a$ (at top of Rdac) and m2$a$ (at bottom of Rdac) are as follows:

m1$a$=($R_{GAIN1}$+$R_{DAC}$+$R_{GAIN2}$)/($R_{DAC}$+$R_{GAIN2}$)=9/5=1.8;

($R_{DAC}$+$R_{GAIN2}$)=1/m1$a$*($R_{GAIN1}$+$R_{DAC}$+$R_{GAIN2}$);

$R_{GAIN1}$=($R_{DAC}$+$R_{GAIN2}$)*(m1$a$−1);

m2$a$=$R_{GAIN2}$/($R_{GAIN1}$+$R_{DAC}$+$R_{GAIN2}$)=1/9;

$R_{GAIN1}$ portion of $R_{total}$ (load between Vref terminals) related to m1$a$ is:

$R_{GAIN1}$=$R_{total}$*(m1$a$−1)/m1$a$;

Vout ratio 4:4:1→$R_{GAIN1}$:$R_{DAC}$:$R_{GAIN2}$, number of R defined by detailed design;

$R_{DAC}$=$R_{GAIN1}$ and $R_{GAIN2}$=$R_{GAIN1}$/4 (due to 4:4:1 ratio), e.g. $R_{GAIN1}$=64R, $R_{DAC}$=64R, $R_{GAIN2}$=16R.

In reference to the single shunt node (326) design of DAC circuit 304:

Attenuation at top of Rdac is m1$b$=($R_{GAIN1A}$+$R_{GAIN1B}$//($R_{DAC}$+$R_{GAIN2}$))/($R_{GAIN1B}$//($R_{DAC}$+$R_{GAIN2}$));

Attenuation at bottom of Rdac is m2$b$=$R_{GAIN2}$/($R_{DAC}$+$R_{GAIN2}$)/m1$b$;

$R_{GAIN2}$=(m*m2/(1−m*m2))*$R_{DAC}$=k2*$R_{DAC}$ (k2 can be pre-defined to simplify the equation); when re-using the same circuitry: $R_{GAIN1}$=$R_{GAIN1A}$+$R_{GAIN1B}$.

Assuming $R_{GAIN1}=k*R_{DAC}$, $R_{GAIN1A}=k1*R_{DAC}$, $R_{GAIN1B}=R_{GAIN1}-R_{GAIN1A}=(k-k1)*R_{DAC}$, the equation can be solved (or sweep k1) based on circuit to make the output voltage equate target:

$m1b=[k1*R_{DAC}+(k-k1)*R_{DAC}//(R_{DAC}+k2*R_{DAC})]/$
$[(k-k1)*R_{DAC}//(R_{DAC}+k2*R_{DAC})]$. After simplification:

$m1b=\{k1*R_{DAC}+(k-k1)*(1+k2)/[(k-k1)+(1+k2)]$
$*R_{DAC}\}/\{(k-k1)*(1+k2)/[(k-k1)+(1+k2)]$
$*R_{DAC}\}$;

$m1b=k1*[1/(1+k2)+1/(k-k1)]+1$;

Re-arrange with regard to k1, $R_{GAIN1A}$ design scalar solution is as follows:

$k1^2+(1+k2)*k1-(m1-1)*(k-k1)*(1+k2)=0$; and $k1^2-[m1*(1+k2)+k]*k1-(m1-1)*(1+k2)*k=0$. After solving the equation to obtain $k1$:

$b=-m1*(1+k2)-k$; $a=1$; $c=(m1-1)*(1+k2)*k$; and

Quadratic equation solution: $k1=[-b+sqrt(b^2-4*a*c)]/2a$ or $[-b-sqrt(b^2-4*a*c)]/2a$. In this case, m1=1.8; m2=1/9; k2=1/4, and k1≈0.34. One solution can be removed because of $R_{GAIN1B}$ becoming negative value (i.e., imaginary value). The solution, therefore, is $R_{GAIN1A}≈22R$, $R_{GAIN1B}=42R$, $R_{GAIN2}=16$ (constraint that $R_{GAIN1}=R_{GAIN1A}+R_{GAIN1B}$ (=64R) can be retained).

For DAC circuit 104: AC impedance on the top of $R_{DAC}$ is $R_{GAIN1}//(R_{DAC}+R_{GAIN2})≈35.5R$; combined resistance (equivalent Rload between reference terminals) is $R_{GAIN1}+R_{DAC}+R_{GAIN2}=144R$; and AC impedance at top $R_{DAC}$/Reference Load Resistance is Z/Rload=35.5/144≈0.25.

For the DAC circuit 304: AC impedance on the top of $R_{DAC}$ is $R_{GAIN1A}//[R_{GAIN1B}//(R_{DAC}+R_{GAIN2})]≈12R$; combined resistance (equivalent Rload between reference terminals) is $R_{GAIN1A}+R_{GAIN1B}//(R_{DAC}+R_{GAIN2})≈49.5R$; and AC impedance at top $R_{DAC}$/Reference Load Resistance is Z/Rload=12/49.5≈0.25.

Figure 4:
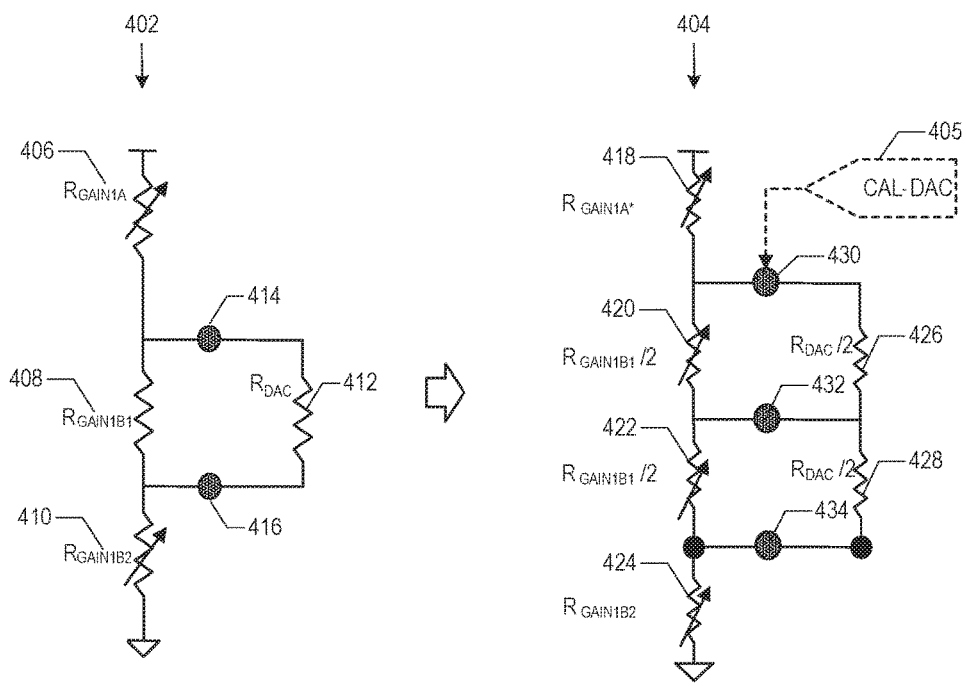
FIG. 4 depicts example DACs using one-sided termination networks with variable attenuation, in accordance with example embodiments.

FIG. 4 depicts example DACs using one-sided termination networks with variable attenuation, in accordance with example embodiments. Referring to FIG. 4, the DAC circuit 402 includes a DAC impedance string 412 and gain resistors 406, 408, and 410 forming a termination impedance path. The termination impedance path is shunted with the DAC impedance string 412 at two shunt nodes 414 and 416 for lowering AC impedance. In an example, one or more of the gain resistors 406, 408, and 410 can provide variable impedance for additional tuning of the DAC circuit 402. As seen in FIG. 4, gain resistors 406 and 410 can include variable resistors or digital potentiometers.

The following is AC impedance for the 1-sided, 2-terminal (e.g., two shunt nodes 414/416) DAC circuit 402. For purposes of the analysis below, Rgain1a 406, Rgain1b1 408 and Rgain1b2 410 are designated as Rgain1a*, Rgain1c, and Rgain1b*. Top of Rdac attenuation factor is designated as m1; bottom of Rdac attenuation factor is designated as m2; Rtotal is the total or equivalent impedance between reference terminals. For given Rdac, Rtotal, attenuation factors (m1 and m2), and Rgain2:

$Rgain1a*=Rtotal*(m1-1)/m1$ (i.e., Rgain1a* does upper reference range attenuation):

$Rgain1b*=Rtotal/m2$ (i.e., Rgain1b* does lower reference range attenuation).

Rgain1a can be defined by m and Rtotal, Rgain1b can be defined by M, Rtotal and Rdac, as follows: Rgain1b=Rtotal/m2.

AC impedance (Z_dactop) at top of Rdac is $Rgain1a*//((Rgain1c//Rdac)+Rgain1b*)$;

$((Rgain1c//Rdac)+Rgain1b*)=>Rtotal/m$ (i.e., by definition of m1 factor attenuation);

$Rgain1a*//(Rtotal/m1)=>Rtotal*(m1-1)/m1//(Rtotal/m1)=>Z\_dactop=Rtotal*(m1-1)/m1^2$.

AC impedance (Z_dacbot) at bottom of Rdac=>$Rgain1b*//((Rgain1c//Rdac)+Rgain1a*)$;

$((Rgain1c//Rdac)+Rgain1a*)=>Rtotal*(m2-1)/m2$ (by definition of m2 factor attenuation);

$Rgain1b*//(Rtotal*(m2-1)/m1)=>(Rtotal/m2)//(Rtotal*(m2-1)/m2)=>Z\_dacbot=Rtotal*(m2-1)/m2^2$.

The above solution for DAC circuit 402 can be used to reduce the AC impedance (at cost of additional network power) for a given Rdac value where conventional attenuation networks can be more limited by Rdac.

In an example, additional shunt coupling within the DAC impedance string can be used (i.e., intra-DAC shunt) to further improve the DAC linearity performance and reduce the AC impedance. DAC circuit 404 uses multiple shunt couplings (e.g., at nodes 430, 432, and 434) between the termination impedance string and the DAC impedance string. Gain resistance Rgain1b and Rgain2 are shown as optimized and merge together into a single gain resistance Rgain1b2 424, which enables performance improvements and area savings. Gain resistance Rgain1b1 has been split into two gain resistances 420 and 422. Similarly the DAC impedance string resistance has been split into two equal resistances 426 and 428. The intra-DAC shunt at node 432 couples a mid-point of the DAC impedance string and a mid-point of Rgain1b1 resistance. Intra-DAC shunt may also be used at other points (e.g., ¼ or ¾) along the DAC impedance string in addition to (or in lieu of) the mid-point shunt at node 432.

Using an intra-DAC shunt (or shunts) can impact the DAC non-linearity. Integral Non-Linearity (INL) error can be defined as the end-point adjusted DC transfer function (TF) error per code. Differential Non-Linearity (DNL) reports the difference in end-point adjusted DC TF errors between consecutive codes (or difference in INL between subsequent codes).

The intra-DAC shunt circuitry (e.g., at node 432 in circuit 404) can operate in parallel with DAC elements within the DAC code range and thus impact on DAC transfer function. The shunt elements may have different matching than the Rdac elements, and best practice resistor matching circuit design and layout design optimization techniques can be used when designing the DAC circuit 404. In instances when the Rgain1b1/2 elements do not match each other in relation to the Rdac impedance elements, INL performance can degrade. Conversely, if the shunt devices match each other better than the DAC circuitry in relation to the Rdac impedance elements (or the DAC impedance string elements are trimmed, tuned or digitally calibrated (e.g., via calibration DAC 405) to provide higher accuracy), the DAC linearity performance can be improved by the intra-DAC shunt network (e.g., at shunt node 432). Therefore, when using shunt network(s) to reduce AC impedance and improving settling performance, verification and optimization for DC accuracy can be performed, checked by simulation verification as a normal best practice.

In an example, an additional current source/sink DAC 405 may be coupled to the DAC impedance string 426-428 to provide calibration capabilities.

Figure 5:
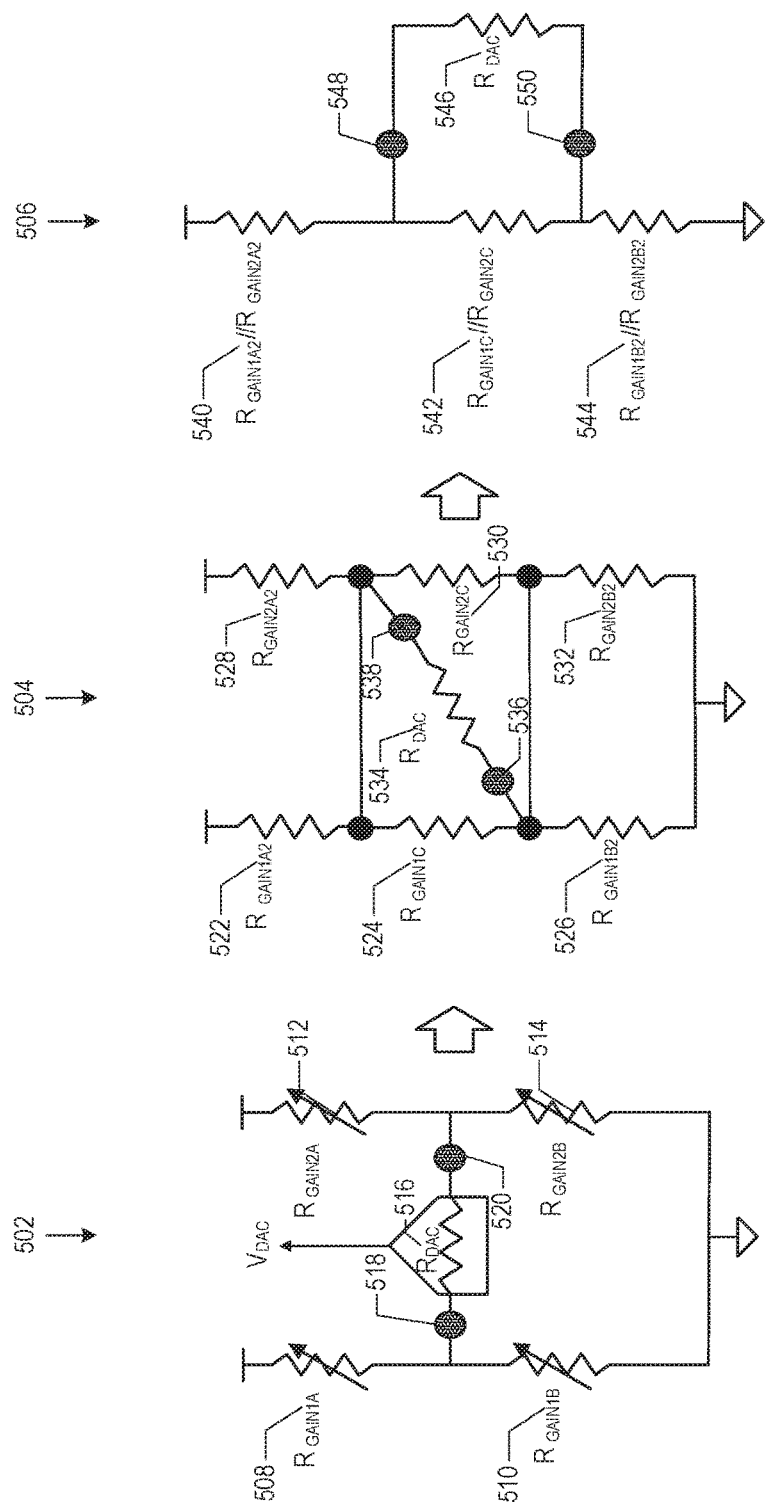
FIG. 5 depicts example DACs using two-sided termination networks with separate termination impedance paths between the reference notes on both sides of the DACs, in accordance with example embodiments.

FIG. 5 depicts example DACs using two-sided termination networks with separate termination impedance paths between the reference nodes on both sides of the DACs, in accordance with example embodiments. In an example, two-sided termination networks can be used to reduce AC impedance, increase the DAC settling speed, as well as provide DAC termination options for DACs generating differential voltage outputs. Referring to FIG. 5, the DAC circuit 502 can include a first termination impedance path formed by gain resistors 508 and 510, and a second termination impedance path formed by gain resistors 512 and 514. The two termination impedance paths are coupled in shunt via the DAC impedance string 516, at shunt nodes 518 and 520, forming an H-bridge design. In an example, the output range of the DAC circuit 502 can be further improved by using variable resistors or digital potentiometers in place of resistors 508, 510, 512, and 514. In this regard, DAC resolution can be increased, especially in instances when multi-string impedances are used within the DAC circuit 502. In an example, the H-bridge DAC circuit 502 can be configured for high-voltage applications as impedances within the two termination impedance paths can be used for scaling down the voltage at the DAC inputs or across the DAC network.

In an example, the DAC impedance string 516 can include multi-string DAC impedances, which can use a passive "loading effect" of sub-strings as a key attribute of their function to achieve the DAC transfer function. Therefore, impedance network couplings (e.g., via nodes 518 and 520) can takes this into account so as not to degrade performance or cause non-functionality.

In instances when multi-string DAC is used, switching circuitry can be added to augment the multi-string DAC "loading effect" where it has been changed due to addition of additional impedance network(s) (e.g., switched resistor network and/or switched current, as defined by DAC digital code). Loading effect variation can also be merged with calibration (loading effect may be small in relation to DC accuracy calibration circuitry requirements).

In an example, the following considerations can be used to determine DAC design and termination options. Impedance string based DAC designs tend to be lower power, especially at higher resolution due to their series elements connections (e.g., series-coupled resistors). In instances when the DAC core is designed with power, area, speed (and other) constraints, it can be determined whether the DAC core is fast enough for the specific implementation, and whether resistor/impedance string based DAC core speed increase is needed. Additional considerations can include whether a multi-stage DAC is needed with more resolution or for high voltage applications. A single termination impedance network solution (e.g., circuits in FIG. 4) can be useful when high resolution toward one reference level at lower power is desired (single or dual shunt node coupling options can be used for higher speed). The H-bridge (dual termination impedance string) solution (e.g., FIG. 5) can be useful for higher speed, enabling further reduction of second terminal AC impedance. The H-bridge solution can be further useful for small LSB size, high resolution within wide voltage range, and for DMOS solution with low voltage DAC within a high voltage (HV) range.

In an example, additional couplings between termination impedance strings in an H-bridge DAC circuit can be used to further reduce the AC impedance and manipulate the DAC output range. For example, DAC circuit 504 can include a first termination impedance string formed by gain resistances 522, 524, and 526, and a second termination impedance string formed by gain resistances 528, 530, and 532. Additional shunt couplings can be made at the bottom of gain resistances 522 and 528, as well as at the bottom of gain resistances 524 and 530.

DAC circuit 506 can be considered equivalent to circuit 504, with the dual termination impedance strings being converted to a single termination impedance string with equivalent impedances. More specifically, termination impedance 540 is equivalent to termination impedances 522 and 528, which are coupled in shunt. Similarly, termination impedances 542 and 544 are equivalent to termination impedances 524, 530, and 526, 532, respectively. The coupling between the two termination impedance paths in circuit 504 can be reflected by the dual shunt nodes 548 and 550 in DAC circuit 506, which coupled in shunt the DAC impedance string 546 and the termination impedance string formed by impedances 540, 542, and 544.

Figure 6:
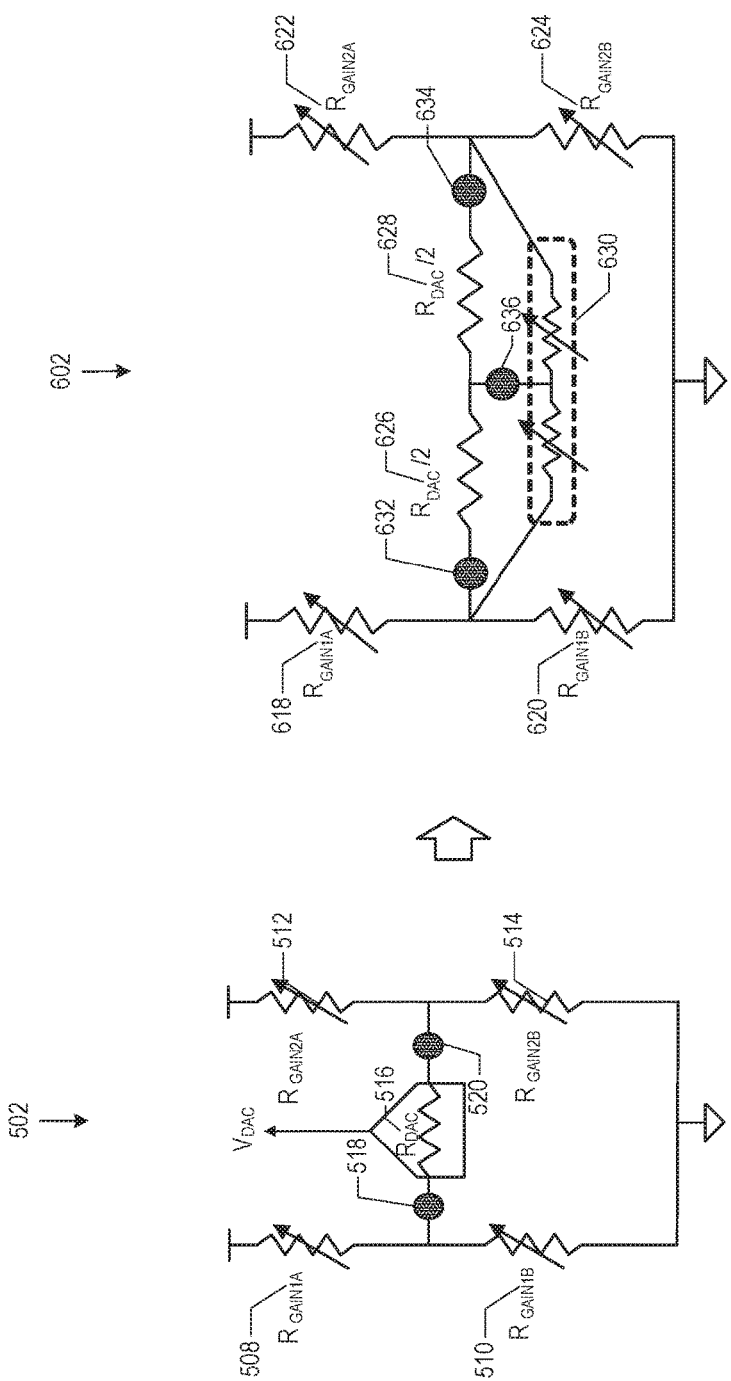
FIG. 6 depicts example DACs using two-sided termination networks with variable attenuation and with an optional parallel termination path between the networks, in accordance with example embodiments.

FIG. 6 depicts example DACs using two-sided termination networks with variable attenuation and with an optional parallel termination path between the networks, in accordance with example embodiments. Referring to FIG. 6, there is illustrated a DAC circuit 602, which can be configured based on the dual termination impedance string DAC circuit 502. More specifically, the first termination impedance string formed by gain resistances 618 and 620 corresponds to the termination impedance string formed by gain resistances 508 and 510. Similarly the second termination impedance string formed by gain resistances 622 and 624 corresponds to the termination impedance string formed by gain resistances 512 and 514. The DAC impedance string 516 can be separated into equivalent impedance strings 626 and 628, which are coupled to both termination impedance paths via the shunt nodes 632 and 634.

In an example, an additional DAC impedance path 630 can be introduced, which is coupled in shunt with the DAC impedance path formed by impedance string 626 and 628. The additional impedance path 630 can be used to further increase the DAC speed; however, it can negatively impact DAC linearity. To further improve DAC linearity, an additional shunt coupling can be made between impedance strings 626, 628 and 630 at note 636. In an example, the midpoint shunt at node 636 can include a current source.

In an example, DAC circuits can be configured to switch between operation modes and use one or more of the DAC circuit designs described herein. Example DAC circuit switching solutions are illustrated in reference to FIG. 7 and FIG. 8.

Figure 7:
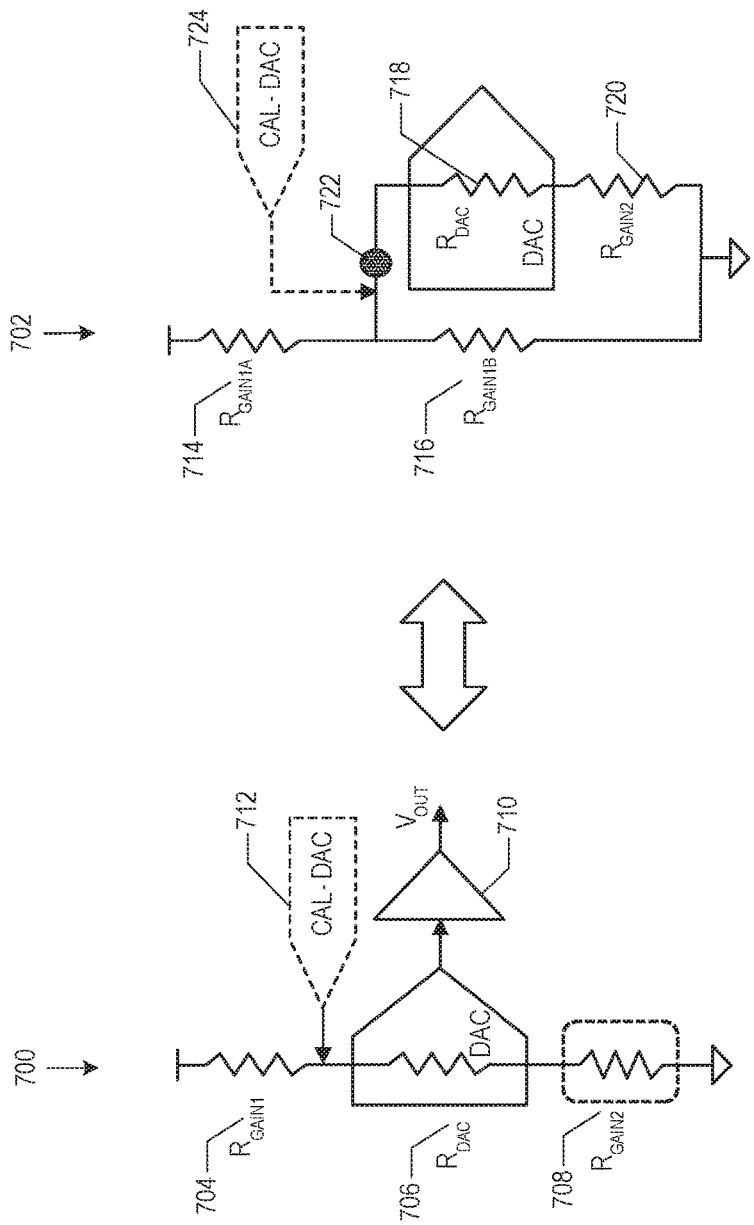
FIG. 7 depicts multimode operation of a DAC circuit as switching between a series DC mode and a shunt AC mode using a one-sided termination impedance network, in accordance with an example embodiment.

FIG. 7 depicts multimode operation of a DAC circuit as switching between a series DC mode and a shunt AC mode using a one-sided termination impedance network, in accordance with an example embodiment. Referring to FIG. 7, a DAC circuit can be configured to switch between a low power, series DC mode associated with DAC circuit 700 and shunt AC mode associated with DAC circuit 702. DAC circuits 700 and 702 are similar to DAC circuits 140 and 304, respectively. More specifically, DAC circuit 700 includes gain resistor 704 and 708 coupled in series with the DAC impedance string 706, which is coupled to a buffer amplifier 710. The DAC circuit 702 includes a termination impedance string formed by gain resistor 714 and 716, with gain resistor 716 being coupled in shunt with the DAC impedance string 718 at shunt nodes 722. An optional gain resistor 720 can be coupled in series with the DAC impedance string 718.

In reference to FIG. 7, switching between DAC operation modes associated with DAC circuits 700 and 702 enables minimum power and faster operation when required, at low circuitry cost. In the example illustrated in FIG. 7, switching between the operation modes can be achieved while the DAC function provides substantially the same output range.

Figure 8:
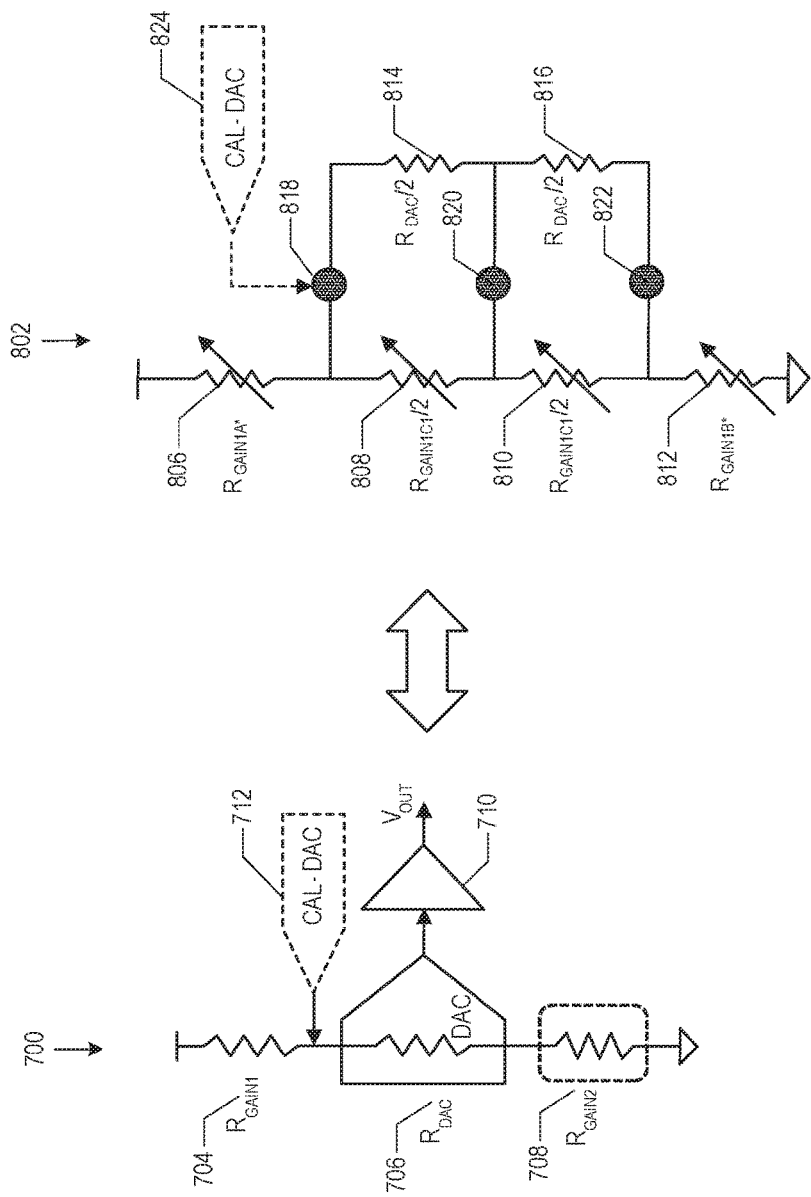
FIG. 8 depicts multimode operation of a DAC circuit as switching between a series DC mode and a shunt AC mode using a one-sided termination impedance network and multiple shunt nodes, in accordance with an example embodiment.

FIG. 8 depicts multimode operation of a DAC circuit as switching between a series DC mode and a shunt AC mode using a one-sided termination impedance network and multiple shunt nodes, in accordance with an example embodiment. Referring to FIG. 8, DAC circuit 802 can be similar to DAC circuit 404 in FIG. 4.

In an example, DAC operation modes can be switched between a series DC mode associated with DAC circuit 700 and the shunt AC mode associated with DAC circuit 802. DAC circuit 802 can include termination impedance path formed by gain resistances 806, 808, 810, and 812 coupled in shunt with DAC impedance strings 814 and 816 at multiple shunt nodes (e.g., 818, 820, and 822). As seen in FIG. 8, Rgain2 708 has been merged into the shunt network of termination impedance string formed by gain resistances 806, 808, 810, and 812.

In an example, different attenuations can be used in different DAC operation modes to enable further power reduction. The signal chain can be changed (e.g., via buffer amplifier feedback network) to effect substantially the same output level, if/as desired, at the key signal output points, and save further power using lower power mode or circuitry (e.g., higher resistance feedback network and/or an alternative amplifier). Dynamically adjusted biasing in amplifier and other low power techniques may also be used. The system micro-architecture level can leverage this flexibility (e.g., divide-by-2, gain-by-2 system (in shunt mode or configuration) swaps to divide-by-8 and gain-by-8 in series, lower power mode).

In an example, Rgain1$b$ 812 can use series switch (not shown in FIG. 8) to three state the shunt path during lower power/slow/DC mode.

In an example, differences between DAC operation modes may be calibrated out using one or more calibration techniques, using DAC correction for AMS correction solution—for example, sampling, measurement, and substantially zeroing difference(s) between both modes (e.g., switched capacitor SAR or re-using an existing ADC function in the system). In an example, optional calibration DACs (e.g., 712, 724 and 824) can be coupled to the DAC to calibrate out range mismatch errors, such as full-scale mismatch. In an example, this can be foreground calibration (e.g., at power-on, factory calibration or calibration can be done on an as needed or used basis to calibrate out variance. In an example, current mode calibration can be bipolar or unipolar and make appropriate mode match the second case (e.g., current source used to "top up" voltage of a second mode with higher nominal full-scale level). In an example, AMS calibration can be used at multiple nodes (e.g., both DAC terminals can perform endpoint calibration). Additional points may also be calibrated. In an example, the calibration DACs can optionally also have a shunt in parallel with it (i.e., iterative version of a solution with shunt inside shunt calibration DAC). In an example, the calibration DACs can include one or more multi-string DACs for reduced component count (e.g., 2-string calibration DAC with 15 or 13 resistors, useful for medium to high accuracy calibration at small cost within a small calibration range).

In an example, DAC circuit 700 can be characterized by DAC attenuation=m1; amplifier closed loop gain≈G1*m1; amplifier feedback network impedance=Z1; and G1 is scalar (e.g., 1). The DAC circuit 802 can be characterized by DAC Attenuation=m2; amplifier closed loop gain≈G2*m2; amplifier feedback network impedance=Z2; and G2 scalar (not necessarily equal to G1).

In an example, for lower DAC power in circuit 700, additional series impedances may be used, which can result in increased attenuation of DAC core signal range. The output signal range can be recovered at the output by increased closed loop gain (CLG) in the amplifier buffer (or elsewhere in the signal chain). In an example, a lower power amplifier or a lower power mode may also be used in this configuration to further reduce power. A higher impedance, lower power feedback network may also be used in another example.

DAC circuit 802 can be used for higher speed as it (preferably) uses lower attenuation (m2) in the shunt configuration to provide lower AC impedance. The amplifier (or signal chain) can use lower CLG and can also use lower impedance and wider bandwidth feedback network in the configuration illustrated in FIG. 8. In an example, not all impedance elements can be used when lower impedance is desired.

Figure 9:
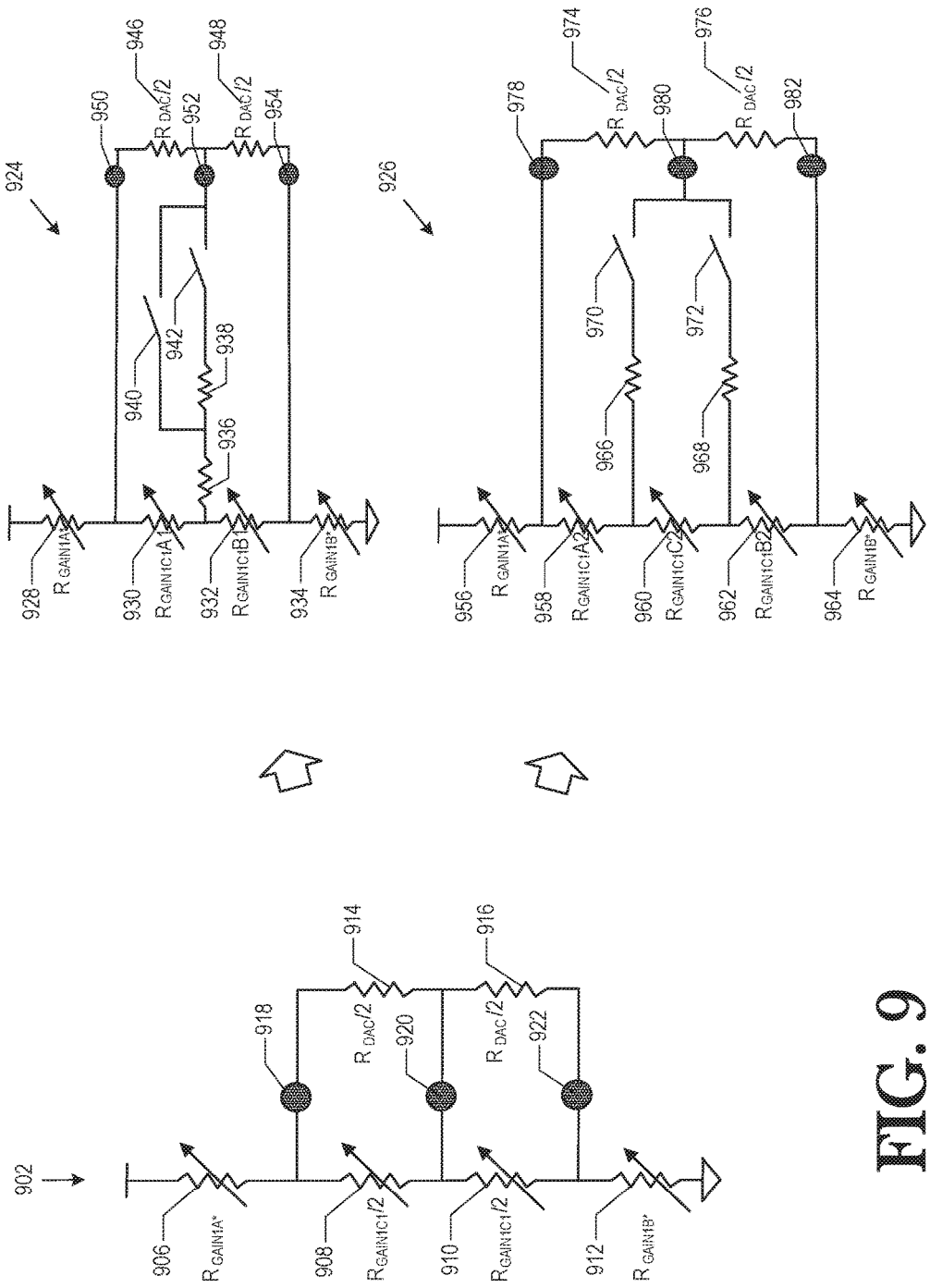
FIG. 9 depicts example DACs using one-sided termination networks with intra-DAC shunt, in accordance with example embodiments.

FIG. 9 depicts example DACs using one-sided termination networks with intra-DAC shunt, in accordance with example embodiments. Referring to FIG. 9, a single termination impedance string with multiple shunt nodes solution is illustrated as DAC circuit 902, which is the same as DAC circuit 802 in FIG. 8. DAC circuit 902 can include termination impedance path formed by gain resistances 906, 908, 910, and 912 coupled in shunt with DAC impedance strings 914 and 916 at multiple shunt nodes (e.g., 918, 920, and 922).

In an example, the intra-DAC shunt at shunt nodes 920 can be a code dependent shunt based on the input data signal communicated to the DAC circuit. More specifically, DAC circuits 924 and 926, which correspond to DAC circuit 902, use code dependent introduction with termination impedance is coupled in series (DAC circuit 924) or in parallel (DAC circuit 926).

DAC circuit 924 can include termination impedance path formed by gain resistances 928, 930, 932, and 934 coupled in shunt with DAC impedance strings 946 and 948 at multiple shunt nodes (e.g., 950, 952, and 954). Intra-DAC shunt between node 952 and midpoint between gain resistors 930 and 932 can be a code dependent shunt using the impedance string formed by series resistors 936 and 938, which are activated by code dependent switches 940 and 942.

DAC circuit 926 can include termination impedance path formed by gain resistances 956, 958, 960, 962, and 964 coupled in shunt with DAC impedance strings 974 and 976 at multiple shunt nodes (e.g., 978, 980, and 982). Intra-DAC shunt connections between node 980 and midpoints between gain resistors 958-960 and 960-962 can be code dependent shunt connections using parallel resistors 966 and 968, which are activated by code dependent switches 970 and 972, respectively.

Figure 10:
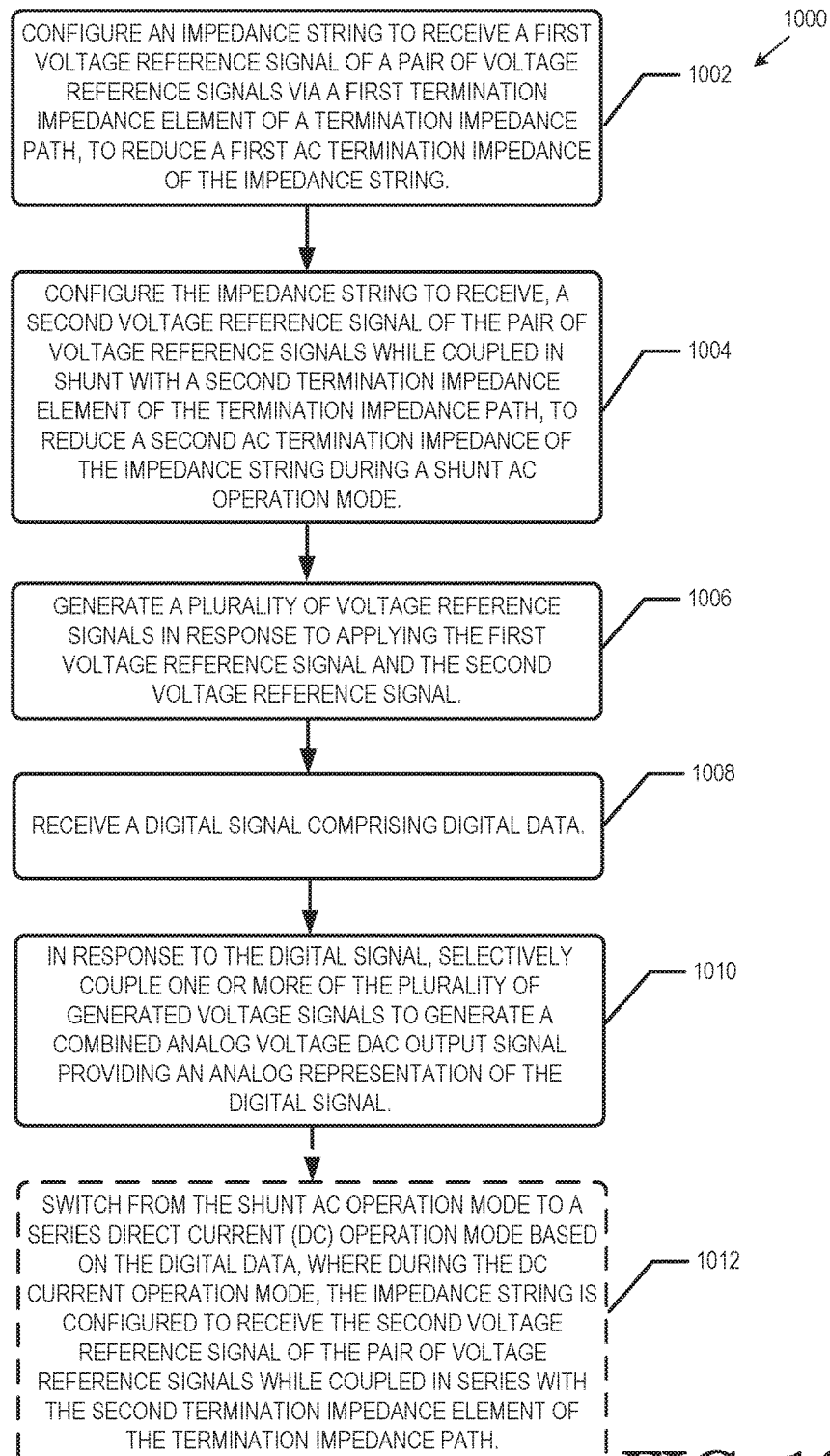
FIG. 10 depicts a flow chart of example functionalities for reducing alternating current (AC) impedance of a DAC circuit, in accordance with an example embodiment.

FIG. 10 depicts a flow chart of example functionalities for reducing alternating current (AC) impedance of a DAC circuit, in accordance with an example embodiment. Referring to FIG. 10, the example method 1000 for reducing alternating current (AC) impedance of a digital-to-analog converter (DAC) circuit can start at 1002, when an impedance string (e.g., 208 in FIG. 2) is configured to receive a first voltage reference signal of a pair of voltage reference signals via a first termination impedance element (e.g., 202A) of a termination impedance path, to reduce a first AC termination impedance of the impedance string. At 1004, the impedance string can be configured to receive a second voltage reference signal of the pair of voltage reference signals while coupled in shunt with a second termination impedance element (e.g., 204) of the termination impedance path, to reduce a second AC termination impedance of the impedance string during a shunt AC operation mode. At 1006, a plurality of voltage reference signals can be generated (e.g., by the DAC impedance string 208 and switching network 209) in response to applying the first voltage reference signal and the second voltage reference signal. At 1008, a digital signal that includes digital data can be received (e.g., a digital signal received by the DAC impedance string 208 and the switching network 209). At 1010, in response to the digital signal, one or more of the plurality of generated voltage signals can be selectively coupled to generate a combined analog voltage DAC output signal providing an analog representation of the digital signal. Optionally, at 1012, switching from a shunt AC operation mode (e.g., as performed by DAC circuit 700) to a series direct current (DC) operation mode (e.g., as performed by DAC circuit 702) can be performed based on the digital data. During the DC current (low-power) operation mode, the impedance string (e.g., 718) can be configured to receive the second voltage reference signal of the pair of voltage reference signals while coupled in series with a termination impedance element (e.g., 720) of the termination impedance path. In an example, switching between the DC and the AC operation modes can take place not based on the data path (e.g., input from 1010) but based on user command or command from a processor (e.g., based on one or more other design or data processing considerations).

Various Notes & Aspects

Aspect 1 is a digital-to-analog converter (DAC) circuit with a parallel impedance network, the DAC circuit comprising: a pair of voltage reference nodes for applying different voltage levels; impedance elements arranged in an impedance string for coupling between the voltage reference nodes to generate a plurality of voltage signals; a termination impedance path, comprising at least a first termination impedance element and a second termination impedance element, the termination impedance path coupled between the voltage reference nodes and at least the second termination impedance element coupled in shunt with the impedance string; and a switching network configured to receive a digital signal and, in response, selectively couple one or more of the plurality of generated voltage signals to generate a combined analog voltage DAC output signal providing an analog representation of the digital signal.

In Aspect 2, the subject matter of Aspect 1 optionally includes wherein the first termination impedance element is coupled in series with one of the voltage reference nodes and the impedance string.

In Aspect 3, the subject matter of any one or more of Aspects 1-2 optionally include wherein the termination impedance path further comprises at least a third termination impedance element coupled in series with the impedance string, and in shunt with the second termination impedance element.

In Aspect 4, the subject matter of any one or more of Aspects 1-3 optionally include a second termination impedance path comprising a plurality of termination impedance elements coupled between the voltage reference nodes, wherein at least a portion of the termination impedance path is in shunt with at least a portion of the second termination impedance path via the impedance string.

In Aspect 5, the subject matter of Aspect 4 optionally includes wherein the termination impedance elements in the termination impedance path and the second termination impedance path are configured to provide variable impedance for tuning linearity of the DAC circuit.

In Aspect 6, the subject matter of any one or more of Aspects 1-5 optionally include wherein the voltage levels are supplied by a voltage source.

In Aspect 7, the subject matter of any one or more of Aspects 1-6 optionally include wherein the voltage levels are generated by a current source coupled to the termination impedance path.

In Aspect 8, the subject matter of any one or more of Aspects 3-7 optionally include wherein the termination impedance path further comprises a fourth termination impedance element, the fourth termination impedance element in series with the first and second termination impedance elements, and in shunt with the impedance string.

In Aspect 9, the subject matter of Aspect 8 optionally includes wherein the second termination impedance element and the third termination impedance element are combined into a fifth termination impedance element coupled in series with the fourth and first termination impedance elements.

In Aspect 10, the subject matter of Aspect 9 optionally includes wherein one or both of the first termination impedance element and the fifth termination impedance element are configured to provide variable impedance.

In Aspect 11, the subject matter of Aspect 10 optionally includes wherein a node within one of the first termination impedance element, the second termination impedance element, and the fourth termination impedance element is coupled in shunt with a node within the impedance string.

Aspect 12 is a digital-to-analog converter (DAC) circuit with multiple parallel impedance networks, the DAC circuit comprising: a pair of voltage reference nodes for applying different voltage levels; a first termination impedance path, comprising at least a first termination impedance element and a second termination impedance element, the first termination impedance path coupled between the voltage reference nodes a second termination impedance path, comprising at least a third termination impedance element and a fourth termination impedance element, the second termination impedance path coupled between the voltage reference nodes and in shunt with the first termination impedance path; a first plurality of impedance elements arranged in an impedance string for coupling between the first termination impedance path and the second termination impedance path, to generate a plurality of voltage signals; and a switching network configured to receive a digital signal and, in response, selectively couple one or more of the plurality of generated voltage signals to generate a combined analog voltage DAC output signal, the DAC output signal providing an analog representation of the digital signal.

In Aspect 13, the subject matter of Aspect 12 optionally includes wherein at least a first portion of the first termination impedance path is coupled in shunt with at least a first portion of the second termination impedance path.

In Aspect 14, the subject matter of Aspect 13 optionally includes wherein a second portion of the first termination impedance path is coupled in shunt with a second portion of the second termination impedance path.

In Aspect 15, the subject matter of any one or more of Aspects 13-14 optionally include a second plurality of impedance elements arranged in a second impedance string, the second impedance string coupled in shunt with the impedance string.

In Aspect 16, the subject matter of Aspect 15 optionally includes wherein a portion of the impedance string is coupled in shunt with a portion of the second impedance string.

In Aspect 17, the subject matter of Aspect 16 optionally includes wherein the portion of the impedance string is coupled in shunt with the portion of the second impedance string via a current source.

Aspect 18 is a method for reducing alternating current (AC) impedance of a digital-to-analog converter (DAC) circuit, the method comprising: configuring an impedance string to receive a first voltage reference signal of a pair of voltage reference signals via a first termination impedance element of a termination impedance path, to reduce a first AC termination impedance of the impedance string; configuring the impedance string to receive, a second voltage reference signal of the pair of voltage reference signals while coupled in shunt with a second termination impedance element of the termination impedance path, to reduce a second AC termination impedance of the impedance string during a shunt AC operation mode; generating a plurality of voltage reference signals in response to applying the first voltage reference signal and the second voltage reference signal; receiving a digital signal comprising digital data; and in response to the digital signal, selectively coupling one or more of the plurality of generated voltage signals to generate a combined analog voltage DAC output signal providing an analog representation of the digital signal.

In Aspect 19, the subject matter of Aspect 18 optionally includes configuring a second termination impedance path to receive the first voltage reference signal and the second voltage reference signal, wherein the second termination impedance path comprises a plurality of termination impedance elements coupled between the voltage reference nodes.

In Aspect 20, the subject matter of Aspect 19 optionally includes wherein at least a portion of the termination impedance path is in shunt with at least a portion of the second termination impedance path via the impedance string.

In Aspect 21, the subject matter of any one or more of Aspects 18-20 optionally include switching from the shunt AC operation mode to a series low-power operation mode based on the digital data, wherein during the low-power operation mode, the impedance string is configured to receive the second voltage reference signal of the pair of voltage reference signals while coupled in series with the second termination impedance element of the termination impedance path. Each of the non-limiting aspects described herein can stand on its own, or can be combined in various permutations or combinations with one or more of the other Aspects.

The above detailed description includes references to the accompanying drawings, which form a part of the detailed description. The drawings show, by way of illustration, specific embodiments in which the invention can be practiced. These embodiments are also referred to herein as "examples" or "aspects." Such aspects can include elements in addition to those shown or described. However, the present inventors also contemplate examples in which only those elements shown or described are provided. Moreover, the present inventors also contemplate aspects using any combination or permutation of those elements shown or described (or one or more aspects thereof), either with respect to a particular aspect (or one or more aspects thereof), or with respect to other aspects (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method aspects described herein can be machine or computer-implemented at least in part. Some aspects can include a computer-readable medium or machine-readable medium encoded with instructions operable to configure an electronic device to perform methods as described in the above aspects. An implementation of such methods can include code, such as microcode, assembly language code, a higher-level language code, or the like. Such code can include computer readable instructions for performing various methods. The code may form portions of computer program products. Further, in an aspect, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A digital-to-analog converter (DAC) circuit with a parallel impedance network, the DAC circuit comprising:

a pair of reference terminals with different voltage levels;
impedance elements arranged in an impedance string for coupling between the reference terminals to generate a plurality of voltage signals;
a termination impedance path, comprising at least a first termination impedance element and a second termination impedance element, the termination impedance path coupled between the reference terminals and at least the second termination impedance element coupled in shunt with the impedance string; and
a switching network configured to receive a digital signal and, in response, selectively couple one or more of the plurality of generated voltage signals to generate a combined analog voltage DAC output signal providing an analog representation of the digital signal,
wherein the termination impedance path further comprises:
at least a third termination impedance element coupled in series with the impedance string, and in shunt with the second termination impedance element, and
a fourth termination impedance element, the fourth termination impedance element in series with the first and second termination impedance elements, and in shunt with the impedance string.

2. The DAC circuit of claim 1, wherein the first termination impedance element is coupled in series with one of the reference terminals and the impedance string.

3. The DAC circuit of claim 1, wherein the voltage levels are supplied by a voltage source.

4. The DAC circuit of claim 1, wherein the voltage levels are generated by a current source coupled to the termination impedance path.

5. The DAC circuit of claim 1, wherein the second termination impedance element and the third termination impedance element are combined into a fifth termination impedance element coupled in series with the fourth and first termination impedance elements.

6. The DAC circuit of claim 5, wherein one or both of the first termination impedance element and the fifth termination impedance element are configured to provide variable impedance.

7. The DAC circuit of claim 1, wherein a node within one of the first termination impedance element, the second termination impedance element, and the fourth termination impedance element is coupled in shunt with a node within the impedance string.

8. A digital-to-analog converter (DAC) circuit with multiple parallel impedance networks, the DAC circuit comprising:
a pair of reference terminals with different voltage levels;
a first termination impedance path, comprising at least a first termination impedance element and a second termination impedance element, the first termination impedance path coupled between the reference terminals;
a second termination impedance path, comprising at least a third termination impedance element and a fourth termination impedance element, the second termination impedance path coupled between the reference terminals and in shunt with the first termination impedance path;
a first plurality of impedance elements arranged in an impedance string for coupling between the first termination impedance path and the second termination impedance path, to generate a plurality of voltage signals; and
a switching network configured to receive a digital signal and, in response, selectively couple one or more of the plurality of generated voltage signals to generate a combined analog voltage DAC output signal, the DAC output signal providing an analog representation of the digital signal.

9. The DAC circuit of claim 8, wherein at least a first portion of the first termination impedance path is coupled in shunt with at least a first portion of the second termination impedance path.

10. The DAC circuit of claim 9, wherein a second portion of the first termination impedance path is coupled in shunt with a second portion of the second termination impedance path.

11. The DAC circuit of claim 9, further comprising:
a second plurality of impedance elements arranged in a second impedance string, the second impedance string coupled in shunt with the impedance string.

12. The DAC circuit of claim 11, wherein a portion of the impedance string is coupled in shunt with a portion of the second impedance string.

13. The DAC circuit of claim 12, wherein the portion of the impedance string is coupled in shunt with the portion of the second impedance string via a current source.

14. A method for reducing alternating current (AC) impedance of a digital-to-analog converter (DAC) circuit, the method comprising:
configuring via switching circuitry, an impedance string to receive a first voltage reference signal of a pair of voltage reference signals via a first termination impedance element of a termination impedance path between reference terminals, to reduce a first AC termination impedance of the impedance string;
configuring via the switching circuitry, the impedance string to receive, a second voltage reference signal of the pair of voltage reference signals while coupled in shunt with a second termination impedance element of the termination impedance path, to reduce a second AC termination impedance of the impedance string during a shunt AC operation mode;
generating a plurality of voltage reference signals in response to applying the first voltage reference signal and the second voltage reference signal;
receiving a digital signal comprising digital data; and
in response to the digital signal, selectively coupling one or more of the plurality of generated voltage signals to generate a combined analog voltage DAC output signal providing an analog representation of the digital signal.

15. The method according to claim 14 further comprising:
configuring a second termination impedance path to receive the first voltage reference signal and the second voltage reference signal, wherein the second termination impedance path comprises a plurality of termination impedance elements coupled between the reference terminals.

16. The method according to claim 15, wherein at least a portion of the termination impedance path is in shunt with at least a portion of the second termination impedance path via the impedance string.

17. The method according to claim 14, further comprising:
switching from the shunt AC operation mode to a series low-power operation mode based on the digital data,
wherein during the low-power operation mode, the impedance string is configured to receive the second voltage reference signal of the pair of voltage reference signals while coupled in series with the second termination impedance element of the termination impedance path.

18. A digital-to-analog converter (DAC) circuit with a parallel impedance network, the DAC circuit comprising:
   a pair of reference terminals with different voltage levels;
   impedance elements arranged in an impedance string for coupling between the reference terminals to generate a plurality of voltage signals;
   a termination impedance path, comprising at least a first termination impedance element and a second termination impedance element, the termination impedance path coupled between the reference terminals and at least the second termination impedance element coupled in shunt with the impedance string; and
   a second termination impedance path comprising a plurality of termination impedance elements coupled between the reference terminals, wherein at least a portion of the termination impedance path is in shunt with at least a portion of the second termination impedance path via the impedance string; and
   a switching network configured to receive a digital signal and, in response, selectively couple one or more of the plurality of generated voltage signals to generate a combined analog voltage DAC output signal providing an analog representation of the digital signal.

19. The DAC circuit of claim 18, wherein the termination impedance elements in the termination impedance path and the second termination impedance path are configured to provide variable impedance for tuning linearity of the DAC circuit.

* * * * *